United States Patent
Bernards et al.

(10) Patent No.: US 10,986,738 B2
(45) Date of Patent: Apr. 20, 2021

(54) CARBON-BASED DIRECT PLATING PROCESS

(71) Applicant: MacDermid Enthone Inc., Waterbury, CT (US)

(72) Inventors: Roger Bernards, South Haven, MN (US); James Martin, Eden Prairie, MN (US); Jason J. Carver, Carver, MN (US)

(73) Assignee: MacDermid Enthone Inc., Waterbury, CT (US)

( * ) Notice: Subject to any disclaimer, the term of this patent is extended or adjusted under 35 U.S.C. 154(b) by 245 days.

(21) Appl. No.: 15/973,814

(22) Filed: May 8, 2018

(65) Prior Publication Data

US 2019/0350089 A1    Nov. 14, 2019

(51) Int. Cl.
| | |
|---|---|
| *C25D 5/54* | (2006.01) |
| *C25D 5/56* | (2006.01) |
| *C23C 28/00* | (2006.01) |
| *H05K 3/42* | (2006.01) |
| *H05K 3/00* | (2006.01) |
| *H05K 3/38* | (2006.01) |

(52) U.S. Cl.
CPC .............. *H05K 3/423* (2013.01); *C25D 5/54* (2013.01); *H05K 3/002* (2013.01); *H05K 3/381* (2013.01); *H05K 3/425* (2013.01); *H05K 2203/0723* (2013.01); *H05K 2203/0763* (2013.01)

(58) Field of Classification Search
CPC . C25D 7/00; C25D 7/001; C25D 5/54; C25D 5/56; C23C 18/1851; C23C 18/1882; C23C 18/20; C23C 28/00
USPC ........................................ 205/159, 210, 164
See application file for complete search history.

(56) References Cited

U.S. PATENT DOCUMENTS

| | | | | |
|---|---|---|---|---|
| 4,619,741 A | * | 10/1986 | Minten | C25D 5/56 205/125 |
| 4,631,117 A | * | 12/1986 | Minten | H05K 3/422 205/126 |
| 4,919,768 A | * | 4/1990 | Bladon | C25D 5/54 174/256 |
| 4,969,979 A | | 11/1990 | Appelt et al. | |
| 5,238,550 A | * | 8/1993 | Burress | C25D 5/54 205/126 |
| 5,476,580 A | * | 12/1995 | Thorn | C25D 5/54 205/122 |
| 5,674,372 A | | 10/1997 | Kukanskis et al. | |
| 5,725,807 A | * | 3/1998 | Thorn | C25D 5/44 106/472 |
| 6,037,020 A | * | 3/2000 | Garlough | H05K 3/424 427/600 |
| 6,171,468 B1 | | 1/2001 | Thorn et al. | |
| 6,585,731 B1 | | 7/2003 | Rattner et al. | |
| 7,214,304 B2 | | 5/2007 | Lee et al. | |
| 9,539,611 B2 | | 1/2017 | Wasserfallen et al. | |
| 2014/0004266 A1 | | 1/2014 | Wasserfallen et al. | |

FOREIGN PATENT DOCUMENTS

| | | |
|---|---|---|
| CN | 103189149 | 7/2013 |
| EP | 2326751 | 4/2013 |
| EP | 1759039 | 4/2017 |

* cited by examiner

*Primary Examiner* — Edna Wong
(74) *Attorney, Agent, or Firm* — Carmody Torrance Sandak & Hennessey LLP

(57) ABSTRACT

A method of preparing a non-conductive substrate to allow metal plating thereon. The method includes the steps of a) contacting the non-conductive substrate with a conditioner comprising a conditioning agent; b) applying a carbon-based dispersion to the conditioned substrate, wherein the carbon-based dispersion comprises carbon or graphite particles dispersed in a liquid solution; and c) etching the non-conductive substrate. The etching step is performed before the liquid carbon-based dispersion dries on the non-conductive substrate.

16 Claims, No Drawings

CARBON-BASED DIRECT PLATING PROCESS

FIELD OF THE INVENTION

The present invention relates generally to a carbon-based direct plating process for printed circuit board manufacture.

BACKGROUND OF THE INVENTION

Printed wiring boards (also known as printed circuit boards or PWB's) are generally laminated materials comprising two or more plates of foils of copper, which are separated from each other by a layer of non-conducting material. Although copper is generally used as the electroplating metal in printed wiring boards, other metals such as nickel, gold, palladium, silver and the like can also be electroplated. The non-conducting layer(s) preferably comprise an organic material such as an epoxy resin impregnated with glass fibers, but may also comprise thermosetting resins, thermoplastic resin, and mixtures thereof, alone or in combination with reinforcing materials such as fiberglass and fillers.

In many printed wiring board designs, the electrical pathway or pattern requires a connection between the separated copper plates at certain points in the pattern. This is usually accomplished by drilling holes at the desired locations through the laminate of copper plates and the nonconducting layer(s) and connecting the separate metal plates. Subsequently, the through-hole walls of the printed wiring board are prepared for electroplating. These plated through-hole walls are necessary to achieve connections between two metal circuit patterns on each side of a printed wiring board, and/or between the inner layer circuit patterns of a multilayer board.

While electroplating is a desirable method of depositing copper and other conductive metals on a surface, electroplating cannot be used to coat a nonconductive surface, such as an untreated through hole. It is therefore necessary to treat the through hole with a conductive material to make it amenable to electroplating.

One process for making the through-hole bores electrically conductive involves physically coating them with a conductive film. The coated through-holes are conductive enough to electroplate, but typically are not conductive and sturdy enough to form the permanent electrical connection between the circuit layers at either end of the through-hole. The coated through-holes are then electroplated to provide a permanent connection. Electroplating lowers the resistance of the through-hole bore to a negligible level, which will not consume an appreciable amount of power or alter circuit characteristics.

One method of preparing through-hole walls for electroplating is a carbon-based process that utilizes a liquid carbon dispersion. The typical steps of this process are as follows:

1) Surfaces of the through-holes are drilled and deburred. In the case of multilayer printed circuit boards, the boards may also be subjected to a desmear or etchback operation to clean the inner copper interfacing surfaces of the through holes;

2) The printed wiring board is preferably subjected to a precleaning process to prepare the printed wiring board to receive the liquid carbon black dispersion thereon;

3) After the application of the cleaner, the PWB is rinsed in water to remove excess cleaner from the board and then contacted with a conditioner solution. The conditioner solution ensures that substantially all of the hole wall surfaces are prepared to accept a continuous layer of the subsequently applied carbon-based dispersion;

4) The liquid carbon-based dispersion is applied to or contacted with the conditioned PWB. The liquid carbon dispersion contains three critical ingredients, namely, carbon black, one or more surfactants capable of dispersing the carbon, and a liquid dispersing medium such as water. The preferred methods of applying the dispersion to the PCB include immersion, spraying or other methods of applying chemicals that are typically used in the printed circuit board industry. A single working bath is generally sufficient for applying the carbon dispersion; however, more than one bath may be used for rework or other purposes; and 5) The carbon-covered printed wiring board is subjected to a step wherein substantially all (i.e., more than about 95% by weight) of the water in the applied dispersion is removed and a dried deposit containing carbon is left in the holes and on other exposed surfaces of the nonconducting layer. This drying step may be accomplished by various methods, including, for example, evaporation at room temperature, heating the PWB for a period of time at an elevated temperature, an air knife, or other similar means generally known to those skilled in the art. To insure complete coverage of the hole walls, the procedure of immersing the board in the liquid carbon dispersion and then drying may be repeated.

Thereafter, the metal portions of the substrate are aggressively etched with high spray pressures and high total etch amounts to sufficiently remove the dried carbon coating from the metal portions of the substrate.

The microetch procedure performs two very desirable tasks at once: (1) the microetch step removes substantially all excess carbon black or graphite material adhering to the outer copper plates or foils and the exposed surfaces of copper inner plates or foils in a multilayer PWB; and (2) the microetch step chemically cleans and microetches slightly the outer copper surfaces, thereby making them good bases for either dry film application or the electrolytic deposition of copper when followed by mechanically scrubbing of the PWB.

The mechanism by which this microetch step works is not by attacking the carbon black material or the graphite material deposited on the copper foil directly, but rather by attacking exclusively the first few atomic layers of copper directly below which provides the adhesion for the coating. The fully coated board is then immersed in the microetch solution to "flake" off the carbon black or graphite from the copper surfaces in the form of micro-flakelets. These microflakelets may then be removed from the microetch bath either by filtration through a pump or via a weir type filter arrangement commonly used in the PWB industry.

The liquid carbon black dispersion or graphite dispersion, the microetch treatment, and the intermittent water rinses are preferably carried out by immersing the PWB in baths constructed of polypropylene or polyvinyl chloride (PVC) and kept agitated by a recirculation pump or pumped in air or by a conveyorized flood or spray machine. The carbon black or graphite coated PWB is immersed in or otherwise contacted with the microetch solution to "flake" off the carbon black or graphite from the copper surfaces which are then removed from the microetch bath by filtering or other similar means.

The steps of this process are described in more detail, for example, in U.S. Pat. No. 4,619,741, the subject matter of which is herein incorporated by reference in its entirety. Various modifications and refinements to this process are set forth in U.S. Pat. Nos. 4,622,107, 4,622,108, 4,631,117, 4,684,560, 4,718,993, 4,724,005, 4,874,477, 4,897,164, 4,964,959, 4,994,153, 5,015,339, 5,106,537, 5,110,355, 5,139,642, 5,143,592, and 7,128,820, the subject matter of each of which is herein incorporated by reference in its entirety.

U.S. Pat. No. 4,897,164 to Piano et al. describes a process in which after the drying step, the dried deposit of carbon black in the through-holes is contacted with an aqueous solution of an alkali metal borate prior to microetching to remove loose or easily removable carbon black particles from the areas of the through-holes.

U.S. Pat. No. 4,964,959 to Piano et al. describes the addition of a conductive polymer or combinations thereof to the carbon back dispersion.

U.S. Pat. No. 4,994,153 to Piano et al. describes a process for treating the tooling holes or slots which have been coated with a carbon black dispersion in a nonconductive material which comprises removing said carbon black with an aqueous solution containing: (a) an alkanolamine; (b) an anionic surfactant which is the neutralized addition product of maleic and/or fumaric acid and a poly(oxylated) alcohol; (c) a nonionic surfactant which is an aliphatic mono and/or diphosphate ester; and (d) an alkali or alkaline earth metal hydroxide.

U.S. Pat. No. 5,015,339 to Pendleton describes an electroplating pretreatment wherein nonconductive material is first contacted with an alkaline permanganate solution, then a neutralizer/conditioner solution and then a carbon black dispersion.

All of the processes described in these references contain a step in which the carbon-covered printed wiring board is subjected to a step wherein substantially all (i.e., more than about 95% by weight) of the water in the applied dispersion is removed and a dried deposit containing carbon is left in the holes and on other exposed surfaces of the nonconducting layer prior to the microetching step.

In a variation on this basic process, the carbon-coated wiring board may be subjected to a fixing step prior to drying in order to remove excess carbon dispersion from the surface of the printed wiring board and to make the carbon dispersion more workable as described, for example, in U.S. Pat. Pub. No. 2010/0034965 to Retallick et al., the subject matter of which is herein incorporated by reference in its entirety. Fixing may be accomplished by a chemical fixing method or by a mechanical fixing method.

In chemical fixing, a fixing solution is applied to the surfaces that have been wetted with the carbon dispersion and the fixing solution removes excess carbon composition deposits, smoothing the carbon coating on the recess surfaces by eliminating lumps and making the coating more uniform. In physical fixing, the recesses or other surfaces of the substrate which have been wetted with the carbon dispersion are subjected to a mechanical force to remove excess deposits of the carbon coating before it is dried. For example, a fluid jet may be used to contact the surfaces that have been coated with the carbon dispersion. The jet blows away any excess accumulation of the carbon deposit and smooths the carbon coating on the recess surfaces by elimination lumps and making the coating more uniform. Another fixing means involves the use of an air jet in the form of an air knife.

Once the carbon-coated printed wiring board has been microetched, the printed wiring board can be electroplated with a suitable conductive metal.

The microetch frequently causes problems, particularly in plating in the area of the copper dielectric interface. In particular, etching the copper frequently also strips the carbon coating from the dielectric area directly adjacent to the copper, thereby creating an insulating barrier for electrical continuity in the subsequent electroplating step. This barrier may then lead to poor plating and defects such as voids, knit lines, and plating folds. To avoid such kinds of defects, a lower microetch step is desirable.

To adequately remove the carbon black or graphite from the copper surfaces, large pumps, high pressures, large etch chambers, and/or aggressive etching chemistry must be employed to produce an acceptable result. In addition, it is also necessary that the equipment be cleaned often to reduce nodulation in the metal plating step for the carbon black or graphite that has been flaked off the copper surfaces.

Thus, it would be desirable to provide a direct plating process that offers reduced nodulation and that also does not require additional processing steps or conditions to produce a good result.

SUMMARY OF THE INVENTION

It is an object of the present invention to provide an improved direct plating process for preparing a PWB to accept electroplating thereon.

It is another object of the present invention to provide an improved direct plating process that offers reduced nodulation.

It is still another object of the present invention to provide a direct plating process that improves electroplating conditions.

To that end, in one embodiment the present invention relates generally to a method of preparing a non-conductive substrate to allow metal plating thereon, the method comprising the steps of:

a) conditioning the non-conductive substrate with a conditioning agent;

b) applying a liquid carbon-based dispersion to the conditioned non-conductive substrate to form a carbon coating on the conditioned non-conductive substrate, wherein the carbon-based dispersion comprises carbon or graphite particles dispersed in a liquid solution; and c) etching the substrate, wherein the etching step is performed before the liquid carbon-based dispersion dries on the non-conductive substrate.

DETAILED DESCRIPTION OF THE PREFERRED EMBODIMENTS

The present invention relates generally to a carbon-based direct plating process for printed circuit board or printed wiring board manufacture.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper", "front", "back", and the like, are used for ease of description to describe one element or feature's relationship to another element(s) or feature(s). It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

In one embodiment, the present invention relates generally to a method of preparing a non-conductive substrate to allow metal plating thereon, the method comprising the steps of:

a) conditioning the non-conductive substrate with a conditioning agent;

b) applying a liquid carbon-based dispersion to the conditioned non-conductive substrate to form a carbon coating on the conditioned non-conductive substrate, wherein the carbon-based dispersion comprises carbon or graphite particles dispersed in a liquid solution; and c) etching the substrate, wherein the etching step is performed before the liquid carbon-based dispersion dries on the non-conductive substrate.

In one embodiment, the non-conductive substrate is a printed wiring board substrate.

Once the etching step is performed, the non-conductive substrate and carbon dispersion can be dried to form a conductive coating on the PWB substrate and the PWB substrate can be plated with an electrodeposited metal.

Surprisingly it has been discovered that an improved result can be obtained if the etching step is performed before the carbon-based coating dries on the substrate. Previously, as discussed above, it was believed that it was necessary to first dry the carbon-based coating onto the surface prior to contacting the substrate with the etching solution. Thus, it had previously been understood that drying of the carbon-based dispersion on the surface was necessary prior to etching the substrate to allow the carbon particles to adhere to the non-conductive portions of the substrate sufficiently to facilitate electroplating of metal onto the non-conductive portions of the substrate.

In contrast, in the present invention, the etching step is performed prior to the drying step and without first drying the carbon suspension solution onto the surface. In other words, the drying step is not performed until after the etching step has been completed.

The benefits of the process described herein include the following:

1) It is much easier to etch metal portions of the substrate if the etching step is performed prior to drying of the carbon coating. While the dried carbon coating layer acts as a barrier to etching the underlying metal, the wet carbon coating layer does not significantly act as a barrier to etching;

2) The total etch amount and spray pressure needed to obtain clean metal portions of the substrate are greatly reduced if the substrate is etched before the carbon coating is dried as compared with after the carbon coating is dried; and 3) The cleanliness of the process and the equipment used to apply the carbon coating is greatly improved because carbon particles are etched off the metal portions of the substrate in the chamber or tank immediately after the chamber or tank containing the carbon suspension/colloid. Normally, this means that the outer surface of the substrate is completely free of carbon such that the rollers and driers normally employed after the carbon suspension solution remain at least substantially free of carbon particles.

Previously, the dried carbon coating was dried before etching and the drying chamber and the rollers of the equipment changer become contaminated with the carbon particles. In contrast, in the present invention, the driers and rollers of the equipment remain clean and free of carbon particles.

Collectively, the benefits of the process described herein also reduce the amount of nodulation that occurs in the metal plating step. Previously, the prior art process allowed for more carbon particles to remain on the metal portions of the substrate because of the difficulty in removing the particles in the etch step and due to carbon contamination from the dried carbon remaining on the equipment that can be redeposited onto the surface of the substrate.

In the present invention, there is much reduced nodulation in the metal plating step because the wet carbon suspension that coats the substrate is etched off of the metal portions of the substrate before drying the coating such that the carbon is removed from the metal portions of the substrate more completely. Thus, there is less opportunity for the equipment to redeposit dried carbon particles back onto the surface. This results in greatly reduced nodule formulation in the metal plating step.

In the process described herein, the PWB may be subjected to a precleaning step in which the PWB is prepared in order to place the PWB in condition for receiving the liquid carbon-based dispersion.

Next, the PWB is subjected to the conditioning step in which the substrate is contacted with a conditioner. In one embodiment, the PWB is contacted with the conditioner by immersing the PWB in the conditioner.

The conditioner contains a conditioning agent having a high molecular weight. In one embodiment, the molecular weight of the conditioning agent is greater than about 100,000 g/mol, more preferably greater than about 500,000 g/mol, and even more preferably greater than about 1,000,000 g/mol. The large molecular weight of the conditioning agent results in the conditioner being in the form of a gel, which allows the carbon particles to cling more closely to the through-hole walls and to withstand the spray etch step, even before the coating is dried.

The PWB substrate is contacted with the conditioner for at least 20 seconds. In one embodiment, the PWB substrate may be contacted with the conditioner for between about 20 seconds to about 5 minutes. In addition, the pH of the conditioner is not critical and generally any pH is suitable. In one embodiment, the conditioner is generally alkaline and pH of about 9 is suitable. However, other pH values between 1 and 14, more preferably between 7 and 14, more preferably between about 8 and about 10 can also be used in the practice of the invention.

The temperature of the conditioner is also not critical and may be above about room temperature or between room temperature and about 150° F., more preferably between about 80 and about 130° F., more preferably between about 85 and about 110° F., or about 95° F.

Thereafter, the PWB is contacted with the carbon-based dispersion.

In one embodiment, the carbon deposition process involves the application of a liquid carbon dispersion to the cleaned and conditioned PWB. The carbon-based dispersion contains three principal ingredients, namely carbon, one or more surfactants capable of dispersing the carbon, and a liquid dispersing medium such as water. The preferred methods of applying the dispersion to the PCB include immersion, spraying or other methods of applying chemicals used in the printed circuit board industry. A single working bath is sufficient for applying this carbon black dispersion. However, more than one bath may be used for rework or other purposes.

In preparing the liquid carbon dispersion, the three primary ingredients, and any other preferred ingredients, are mixed together to form a stable dispersion. This may be accomplished by subjecting a concentrated form of the dispersion to ball milling, colloidal milling, high-shear milling, ultrasonic techniques or other like procedures to thoroughly mix the ingredients. The dispersion can then be later diluted with more water to the desired concentration for the working bath.

One preferred method of mixing is ball milling a concentrated form of the dispersion in a container having glass mineral or plastic beads therein for at least about 1 hour, and mixing can continue for up to about 24 hours. This thorough mixing allows the carbon particles to be intimately coated or wetted with the surfactant. The mixed concentrate is then mixed with water or another liquid dispersing medium to the desired concentration. In one preferred embodiment, the working bath is kept agitated during both the diluting and applying steps to maintain dispersion stability.

In addition, the carbon dispersion must also exhibit desirable traits, including a binder material that will allow the carbon particles to coagulate onto the conditioned wall surface and form a gel-like carbon/conditioner coating.

In one embodiment, the particle diameter of the carbon particles averages no more than about 3 microns while in the dispersion. It is desirable to have an average particle diameter of carbon as small as possible to obtain desired plating characteristics, including substantially even plating and no plating pullaways. The average particle diameter of the carbon particles is preferably between about 0.05 microns to about 3.0 microns, more preferably between about 0.08 microns and about 1.0 microns when in the dispersion. As used herein, the term "average particle diameter" refers to the average mean diameter of the particles (the average by number). The average mean diameter in the dispersion may be determined through the use of either a NiComp Model 370 submicron particle sizer (Version 3.0) or a HIAC PA-720 automatic particle size analyzer (both available from the HIAC/ROYCO Instrument Division of Pacific Scientific of Menlo Park, Calif.). It is also important to maintain the size distribution of the carbon particles to a relatively narrow distribution.

Many types of carbon can be used, including, for example, commonly available carbon blacks, furnace blacks, and suitable small particle graphite. However, it is preferred to utilize carbon blacks which are initially acidic or neutral, i.e. those which have a pH of between about 1 and about 7.5, more preferably between about 2 and about 4 when slurried with water. Preferred carbon black particles are also very porous and generally have as their surface area from about 45 to about 1100, and preferably about 300 to about 600, square meters per gram, as measured by the BET method (method of Brunauer-Emmert-Teller).

Examples of some commercially available carbon blacks suitable for use in the present invention include Cabot XC-72R Conductive, Cabot Monarch 800, Cabot Monarch 1300 (all available from Cabot Corporation of Boston, Mass.). Other suitable carbon blacks include Columbian T-10189, Columbian Conductiex 975 Conductive, Columbian CC-40,220, and Columbian Raven 3500 (all available from Columbian Carbon Company of New York, N.Y.). Suitable graphites include Showa-Denko UFG (available from Showa-Denko K.K., 13-9 Shiba Daimon 1-Chrome, Minato-Ku, Tokyo, 105 Japan), Nippon Graphite AUP (available from Nippon Graphite Industries, Ishiyama, Japan), and Asbury Micro 850 (available from Asbury Graphite Mills of Asbury, N.J.).

In addition to water and carbon, a surfactant capable of dispersing the carbon in the liquid dispersing medium is employed in the dispersion. One or more surfactants are added to the dispersion to enhance wetting ability and stability of the carbon and to permit maximum penetration by the carbon within the pores and fibers of the non-conducting layer of the PCB. Suitable surfactants include anionic, nonionic and cationic surfactants (or combinations thereof such as amphoteric surfactants). The surfactant should be soluble, stable and preferably non-foaming in the liquid carbon dispersion. In general, for a polar continuous phase as in water, the surfactant should preferably have a high HLB number (8-18).

The preferred type of surfactant will depend mainly on the pH of the dispersion. In one preferred embodiment, the total dispersion is alkaline (i.e. has an overall pH in the basic range). In this case, it is preferred to employ an anionic or nonionic surfactant.

Examples of acceptable anionic surfactants include sodium or potassium salts of naphthalene sulfonic acid such as DARVAN No. 1 (commercially available from Eastern Color and Chemical), PETRO AA and PETRO ULE (commercially available from Petro Chemical Co., Inc.), and AEROSOL OT (commercially available from American Cyanamid). Preferred anionic surfactants include neutralized phosphate ester-type surfactants such as MAPHOS 55,56,8135, 60A and L6 (commercially available from BASF Chemical Co.). Examples of suitable nonionic surfactants include ethoxylated nonyl phenols such as the POLY-TERGENT B-series (commercially available from Olin Corporation) or alkoxylated linear alcohol's such as the POLY-TERGENT SL-series (also commercially available from Olin Corporation).

Advantageously, carbon is present in the dispersion in an amount of less than about 15% by weight of the dispersion, preferably less than about 5% by weight, most preferably less than about 2% by weight, particularly when the form of carbon is carbon black. It has been found that the use of higher concentrations of carbon blacks may provide undesirable plating characteristics. In the same regard, the solids content (i.e. all of the ingredients other than the liquid dispersing medium) is preferably less than about 10% by weight of the dispersion, more preferably, less than about 6% by weight.

The liquid carbon dispersion is typically placed in a vessel and the printed circuit board is immersed in, sprayed with or otherwise contacted with the liquid carbon dispersion. The temperature of the liquid dispersion in an immersion bath should be maintained at between about 60° F. and about 95° F. and preferably between about 70° F. and about 80° F. during immersion. The period of immersion advantageously ranges from about 15 seconds to about 10 minutes, more preferably from about 30 seconds to 5 minutes. The pH is not critical to the practice of the invention, but typical carbon dispersions and colloids are alkaline.

The desired thickness of the carbon coating is a thickness that sufficient to allow for a copper or other metal film to be electroplated onto the printed circuit board in a direct plate process. The upper limit of the thickness is determined by the ability to remove the carbon coating from the copper surfaces. If the carbon does not come off of the copper surfaces, then defects in the circuit board can occur, including poor copper to copper contact in the innerlayers of the circuit board. This is also referred to as "interconnect defect." In one embodiment, this thickness may be in the range of about 0.05 to about 0.25 microns.

However, as discussed above what is important is that the thickness is sufficient to allow for metal plating in a direct plating process without any defects.

In one embodiment, the PWB is contacted with compressed air to unplug any through-holes that may retain plugs of the dispersion.

The carbon black or graphite dispersion on the PWB not only coats the drilled through hole surfaces, which is desirable, but also entirely coats the metal (i.e., copper) plate or foil surfaces, which is undesirable. Therefore, prior to subsequent operations, all of the carbon black or graphite must be removed from the copper (or other metal) plate and/or foil surfaces.

The removal of the carbon black or graphite, specifically from the copper (or other metal) surfaces including, especially, the rims of the drilled holes while leaving the coating intact on the glass fibers and epoxy surfaces of the hole walls is accomplished using a microetch step.

After the microetch step and a subsequent water rinse, the PWB may either proceed to a photo-imaging process and later be electroplated or be directly panel electroplated. The PWB may be further cleaned with, for example, a citric acid or benzotriazole anti-tarnish solution or another acid cleaner solution, or both, after the above described microetch step. The thus treated printed wiring board is then ready for the electroplating operation which includes immersing the PWB in a suitable electroplating bath to apply a copper (or other metal) coating on the through hole walls of the non-conducting layer.

Microetch solutions used to remove excess graphite and/or carbon black are typically based on oxidizing agents such as hydrogen peroxide or a persulfate, such as sodium persulfate. For example, a sodium persulfate-based microetch solution may be combined with sufficient sulfuric acid to make a microetch bath containing 100 to 300 grams of sodium persulfate per liter of deionized water and about 1 to 10% by weight sulfuric acid.

Any etchant that is suitable for the metal being plated may be used in the practice of the invention. For example, for copper plating, sodium persulfate-based etchants, peroxide sulfuric-acid based etchants, copper chloride-based etchants, ferric-based etchants are all suitable for use. However, any oxidizer that is capable of oxidizing copper metal to copper ion is sufficient and is usable in the process described herein.

As described herein, the carbon coating is not dried prior to etching. In addition, is also possible to perform the metal plating step as well without first drying the carbon coating. However, it is only necessary that the carbon coating is not dried prior to the etching step. Thus, in one preferred embodiment, the carbon coating is not dried prior to the etching step. In another preferred embodiment, the carbon coating is not dried before the etching step or the plating step.

After the etching step (or the etching and plating steps), the printed circuit board is dried for a period of time to remove water. In one embodiment, the printed circuit board is dried for a period of about 20 seconds to about 90 seconds, more preferably about 30 seconds to about 60 seconds at an elevated temperature. The elevated temperature may be between about 125 and about 200° F., more preferably between about 150 and 175° F.

The plated metal is typically copper. However, the present invention is not limited to copper plated and the plated metal may be any metal that is capable of being reduced onto the carbon film, including, for example, nickel, rhodium, platinum, cobalt, gold, tin, lead, and alloys of any of the foregoing. Other metals would also be known to those skilled in the and can be plated using the process described herein.

The invention will now be discussed in relation to the following non-limiting examples.

Example 1

A circuit board containing through holes was processed as follows:

1) The circuit board is immersed into a conditioner (Shadow Cleaner Conditioner V, available from MacDermid Enthone Inc., Waterbury, Conn.) conditioning bath made up at 10% by volume component A and 10% by volume component B for 30 seconds at 95° F. Component A contains a conditioning agent and Component B contains a surfactant and buffer.

2) The circuit board is rinsed with tap water for 30 seconds.

3) The circuit board is immersed into 40% by volume Shadow Conductive Colloid 5 (available from MacDermid Enthone Inc., Waterbury, Conn.). The bath contains 40 g/L graphite colloid.

4) The circuit board is spray etched at 20 psi using 80 g/L sodium persulfate etch.

5) The board is spray rinsed at 20 psi using tap water.

6) The board is directly electroplated with copper for one hour at 20 A/ft$^2$ using a bath containing 80 g/L copper sulfate pentahydrate, 200 g/L sulfuric acid, 60 ppm chloride ions, and 1% PC606 additive (available from MacDermid Enthone Inc, Waterbury, Conn.).

Upon inspection of the copper plated printed circuit board, there were no pin holes in the plated copper deposit.

Example 2

A printed circuit board containing through-holes was processed as follows:

1) The circuit board is immersed into a conditioner (Shadow Cleaner Conditioner V, available from MacDermid Enthone Inc., Waterbury, Conn.) conditioning bath made up at 10% by volume component for 30 seconds at 95° F.

2) The printed circuit board is rinsed with tap water for 30 seconds.

3) The printed circuit board is immersed into 40% by volume Shadow Conductive Colloid 5 (available from MacDermid Enthone Inc., Waterbury, Conn.). The bath contains 40 g/L graphite colloid.

4) The printed circuit board is spray etched at 20 psi using 80 g/L sodium persulfate etch.

5) The printed circuit board is spray rinsed at 20 psi using tap water.

6) The printed circuit board is dried with forced air at 150° F. for 30 seconds to dry the coating.

7) The printed circuit board is stored for one week.

8) The printed circuit board is electroplated with copper for one hour at 20 A/ft$^2$ using a bath containing 80 g/L copper sulfate pentahydrate, 200 g/L sulfuric acid, 60 ppm chloride ions, and 1% PC606 additive (available from MacDermid Enthone Inc, Waterbury, Conn.).

Upon inspection of the copper plated printed circuit board, there were no pin holes in the plated copper deposit.

Examples 1 and 2 demonstrate that the process described herein can be used for direct plating either directly or after storage for a period of time and still produce the desirable result of a printed circuit board exhibiting no pin holes or other defects in the plated copper deposit.

Comparative Example 1

Two circuit board coupons containing through-holes were processed as follows:

1) The circuit board coupons were immersed in a conditioning bath that was prepared by mixing 1 g/L of Cyastat SP polymer (a relatively low molecular weight polymer having a molecular weight of less than 10,000 g/mol, available from Cytec Solvay Group, Bruxelles, Belgium) and 1 g/L monoethanolamine (for pH adjustment).

2) The circuit board coupons are rinsed in deionized water.

3) The circuit board coupons are immersed into a graphite dispersion prepared with 4 wt. % graphite particles and 4 wt. % low molecular weight dispersion surfactant (Zetasperse 3800, available from Air Products and Chemicals, Inc., Allentown, Pa.).

4) The printed circuit board coupons were split—one was dried after step 3) and one was spray etched at 10 psi in 80 g/L sodium persulfate etch bath.

5) The coupons were electroplated in a standard acid copper electroplating bath (MacDermid PC 606, available from MacDermid Enthone Inc, Waterbury, Conn.).

The coupon that was dried immediately after the graphite dispersion dip plated copper in the through-holes. However, the coupon that was spray etched did not plate any significant copper in the through-holes because the graphite dispersion was washed off the through-hole wall surfaces of the circuit board by the spray etch.

Finally, it should also be understood that the following claims are intended to cover all of the generic and specific features of the invention described herein and all statements of the scope of the invention that as a matter of language might fall there between.

What is claimed is:

1. A method of preparing a non-conductive substrate to allow metal plating thereon, the method comprising the steps of:
   a) conditioning the non-conductive substrate with a conditioning agent, wherein the conditioning agent comprises at least 10% by volume of a conditioner having a molecular weight of at least 1,000,000 g/mol;
   b) applying a liquid carbon-based dispersion to the conditioned non-conductive substrate to form a carbon coating on the conditioned non-conductive substrate, wherein the carbon-based dispersion comprises carbon or graphite particles dispersed in a liquid solution, wherein the carbon particles coagulate onto the conditioned non-conductive substrate to form a carbon/conditioner gel coating; and
   c) etching the substrate,
      wherein the etching step is performed before the liquid carbon-based dispersion dries on the non-conductive substrate.

2. The method according to claim 1, further comprising the step of drying the substrate and carbon-based dispersion after step c) to form a conductive carbon coating on the substrate.

3. The method according to claim 2, further comprising the step of electroplating a conductive metal on the substrate after step c).

4. The method according to claim 3, wherein the carbon-based dispersion is dried after the etching step and before the electroplating step.

5. The method according to claim 3, wherein the carbon-based dispersion is not dried before the etching step or the electroplating step.

6. The method according to claim 3, wherein the carbon-based dispersion is dried after the etching step and after the electroplating step.

7. The method according to claim 3, wherein the conductive metal electroplated on the substrate is etched with an etchant, the etchant being selected from the group consisting of sodium persulfate-based etchants, peroxide sulfuric-acid based etchants, copper chloride-based etchants, and ferric-based etchants.

8. The method according to claim 1, wherein the substrate comprises a printed circuit board or a printed wiring board.

9. The method according to claim 1, wherein the substrate is contacted with the conditioner by immersing the substrate in the conditioner for at least about 20 seconds.

10. The method according to claim 1, wherein the carbon-based dispersion further comprises one or more surfactants capable of dispersing the carbon or graphite particles.

11. The method according to claim 1, wherein the average particle diameter of the carbon or graphite particles is between about 0.05 and about 3.0 microns.

12. The method according to claim 1, wherein concentration of the carbon or graphite particles in the carbon-based dispersion is less than about 15% by weight.

13. The method according to claim 1, wherein the substrate is dried for about 20 to about 90 seconds at a temperature of between about 125 and about 200° F.

14. The method according to claim 13, wherein the substrate is dried for about 30 to about 60 seconds.

15. The method according to claim 13, wherein the substrate is dried at a temperature of between about 150 and about 175° F.

16. The method according to claim 1, wherein the non-conductive substrate is conditioned with the conditioning agent at a temperature of between about 85 and about 110° C.

* * * * *